United States Patent
Rathsack et al.

(10) Patent No.: US 7,910,289 B2
(45) Date of Patent: Mar. 22, 2011

(54) USE OF DUAL MASK PROCESSING OF DIFFERENT COMPOSITION SUCH AS INORGANIC/ORGANIC TO ENABLE A SINGLE POLY ETCH USING A TWO-PRINT-TWO-ETCH APPROACH

(75) Inventors: Benjamen Michael Rathsack, Richardson, TX (US); James Walter Blatchford, Richardson, TX (US); Steven Arthur Vitale, Murphy, TX (US)

(73) Assignee: Texas Instruments Incorporated, Dallas, TX (US)

(*) Notice: Subject to any disclaimer, the term of this patent is extended or adjusted under 35 U.S.C. 154(b) by 466 days.

(21) Appl. No.: 11/326,392

(22) Filed: Jan. 6, 2006

(65) Prior Publication Data
US 2007/0161245 A1 Jul. 12, 2007

(51) Int. Cl.
*G03F 7/20* (2006.01)
(52) U.S. Cl. .................................................... 430/316
(58) Field of Classification Search .................. 430/394, 430/311
See application file for complete search history.

(56) References Cited

U.S. PATENT DOCUMENTS

| | | | |
|---|---|---|---|
| 2002/0001975 A1* | 1/2002 | Lee | 438/795 |
| 2002/0059557 A1* | 5/2002 | Shin et al. | 716/19 |
| 2004/0043623 A1* | 3/2004 | Liu et al. | 438/736 |
| 2005/0032371 A1* | 2/2005 | An et al. | 438/689 |
| 2005/0142497 A1* | 6/2005 | Ryou et al. | 430/311 |
| 2005/0191852 A1* | 9/2005 | Takigawa et al. | 438/637 |
| 2005/0250330 A1* | 11/2005 | Chen et al. | 438/689 |
| 2006/0046484 A1* | 3/2006 | Abatchev et al. | 438/689 |

* cited by examiner

*Primary Examiner* — Kathleen Duda
*Assistant Examiner* — Brittany Raymond
(74) *Attorney, Agent, or Firm* — Warren L. Franz; Wade J. Brady, III; Frederick J. Telecky, Jr.

(57) ABSTRACT

In accordance with the invention, there are methods of making an integrated circuit, an integrated circuit device, and a computer readable medium. A method can comprise forming a first layer over a semiconductor substrate, forming a first mask layer over the semiconductor substrate, and using the first mask layer to pattern first features. The method can also include forming a second mask layer over the first features, using the second mask layer to pattern portions of the first features, removing the second mask layer, and removing the first mask layer.

19 Claims, 18 Drawing Sheets

USE OF DUAL MASK PROCESSING OF DIFFERENT COMPOSITION SUCH AS INORGANIC/ORGANIC TO ENABLE A SINGLE POLY ETCH USING A TWO-PRINT-TWO-ETCH APPROACH

DESCRIPTION OF THE INVENTION

1. Field of the Invention

The subject matter of this invention relates to photolithography and methods of semiconductor processing. More particularly, the subject matter of this disclosure relates to photolithography methods used to improve critical dimensions of semiconductor devices.

2. Background of the Invention

Lithographic projection apparatus (tools) can be used, for example, in the manufacture of integrated circuits (ICs). When using the various tools, a mask can be used that contains a circuit pattern corresponding to an individual layer of the IC. This pattern, usually having many designs, can be imaged onto a target portion (e.g., comprising one or more dies) on a substrate, such as a silicon or other wafer comprising a semiconductor, that has been coated with a layer of radiation-sensitive material, such as a resist. In general, a single wafer may contain a network of adjacent target portions that can be successively irradiated using a projection system of the tool, one at a time. In one type of lithographic projection apparatus, each target portion is irradiated by exposing the entire mask onto the target portion in one shot. In another apparatus, which is commonly referred to as a step-and-scan apparatus, each target portion is irradiated by progressively scanning the mask under the projection beam in a given reference direction (the "scanning" direction) while synchronously scanning the substrate table parallel or anti-parallel to the scanning direction. Because the projection system typically has a magnification factor M, which is generally less than 1, the speed V at which the substrate table is scanned will be a factor M times that at which the mask table is scanned. More information about lithographic apparatus can be found, for example, in U.S. Pat. No. 6,046,792, which is incorporated by reference herein in its entirety.

In a manufacturing process using a lithographic projection apparatus, a mask can be imaged onto a substrate that is at least partially covered by a layer of resist. Prior to this imaging step, the substrate may undergo various procedures, such as priming, resist coating, and a soft bake. After exposure, the substrate can be subjected to other procedures, such as a post-exposure bake (PEB), development, a hard bake, and a measurement/inspection of the imaged features. This array of procedures can be used as a basis to pattern an individual layer of a device, such as an IC. Such a patterned layer may then undergo various processes, such as etching, ion-implantation, doping, metallization, oxidation, chemical mechanical polishing (CMP), etc., all intended to complete an individual layer. If several layers are required, then part or all of the procedure, or a variant thereof, may need to be repeated for each new layer. Eventually, multiple devices can be present on the substrate. These devices can then be separated from one another by a technique such as dicing or sawing. Thereafter, the individual devices can be mounted on a carrier, connected to pins, etc.

The lithographic tool may be of a type having two or more substrate tables (and/or two or more mask tables). In such "multiple stage" tools, the additional tables may be used in parallel, or preparatory steps may be carried out on one or more tables while one or more other tables are being used for exposure.

The photolithography masks, also called photomasks, referred to above comprise geometric designs, also called mask features, corresponding to the circuit components or structures to be integrated onto a substrate. The layouts used to create such masks are typically generated using computer-aided design (CAD) programs, sometimes called electronic design automation (EDA). Most CAD programs follow a set of predetermined design rules in order to create functional masks. These rules are set by processing and design limitations. Design rules can define the space tolerance between circuit devices, such as, for example, gates, contact holes, or interconnect lines, so as to ensure that the circuit devices or lines do not interact with one another in an undesirable way.

One of the goals in IC fabrication is to faithfully reproduce the original circuit design on the wafer using the mask. Another goal is to use as much of the wafer real estate as possible. As the size of an IC is reduced and its density increases, however, the critical dimension (CD) of its corresponding mask approaches the resolution limit of the optical exposure tool. The resolution for an exposure tool can be defined as the minimum feature sizes that the exposure tool can repeatedly expose on the wafer. The resolution value of present exposure tools often constrains the CD for many advanced IC designs.

Accordingly, the present invention solves the problem of integrating a dual print/ dual etch process flow, using two masking layers, which may be organic, inorganic, or a combination of both. Also the invention solves the problem of integrating a dual print/dual etch process flow which allows removal of ghost features, as well as other problems of the prior art.

SUMMARY OF THE INVENTION

In accordance with the invention, there is a method of making an integrated circuit. The method can comprise forming a first layer over a semiconductor substrate, forming a first mask layer over the semiconductor substrate, and using the first mask layer to pattern first features. The method can also include forming a second mask layer over the first features, using the second mask layer to pattern portions of the first features; removing the second mask layer, and removing the first mask layer.

In accordance with another embodiment there is another method of making an integrated circuit. The method can comprise depositing a first layer over a semiconductor substrate, depositing a first mask layer over the first layer, and depositing a second mask layer over the first mask layer. The method can also comprise using the second mask layer and the first mask layer to form first features, depositing a third mask layer over the semiconductor substrate, patterning the third mask layer to expose a portion of the first features, and using the third mask to form second features.

In accordance with another embodiment there is another method of making an integrated circuit. The method can comprise depositing a first layer over a semiconductor substrate, depositing a first mask layer over the first layer, and patterning the first mask layer to form first features. The method can also comprise depositing a second mask layer over the first features, patterning the second mask layer to expose a portion of the first features and a portion of the first mask layer, and removing exposed portions of the first layer.

In accordance with another embodiment there is a semiconductor device formed according to the method comprising using a first mask layer to pattern first features in a first layer formed over a semiconductor substrate, forming a second mask layer over the first features, and using the second mask layer to pattern portions of the first features and to pattern a portion of the first layer. The method also comprises removing the second mask layer and removing the first mask layer.

In accordance with another embodiment there is a computer readable medium comprising program code that configures a processor to perform a method of making a semiconductor device. The computer readable medium comprises program code for using a first mask layer to pattern first features in a first layer formed over a semiconductor substrate, program code for forming a second mask layer over the first features, and program code for using the second mask layer to pattern portions of the first features and to pattern a portion of the first layer. The computer readable medium also comprises program code for removing the second mask layer and program code for removing the first mask layer.

Additional advantages of the embodiments will be set forth in part in the description which follows, and in part will be obvious from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIGS. 2A'-2D' depict cross-sectional views of the various steps corresponding to FIGS. 2A-2D, respectively.

FIGS. 3A'-3D' depict cross-sectional views of the various steps corresponding to FIGS. 3A-3D, respectively.

FIGS. 4A'-4D' depict cross-sectional views of the various steps corresponding to FIGS. 4A-4D, respectively.

FIGS. 5A'-5E' depict cross-sectional views of the various steps corresponding to FIGS. 5A-5E, respectively.

DESCRIPTION OF THE EMBODIMENTS

Figure 1:
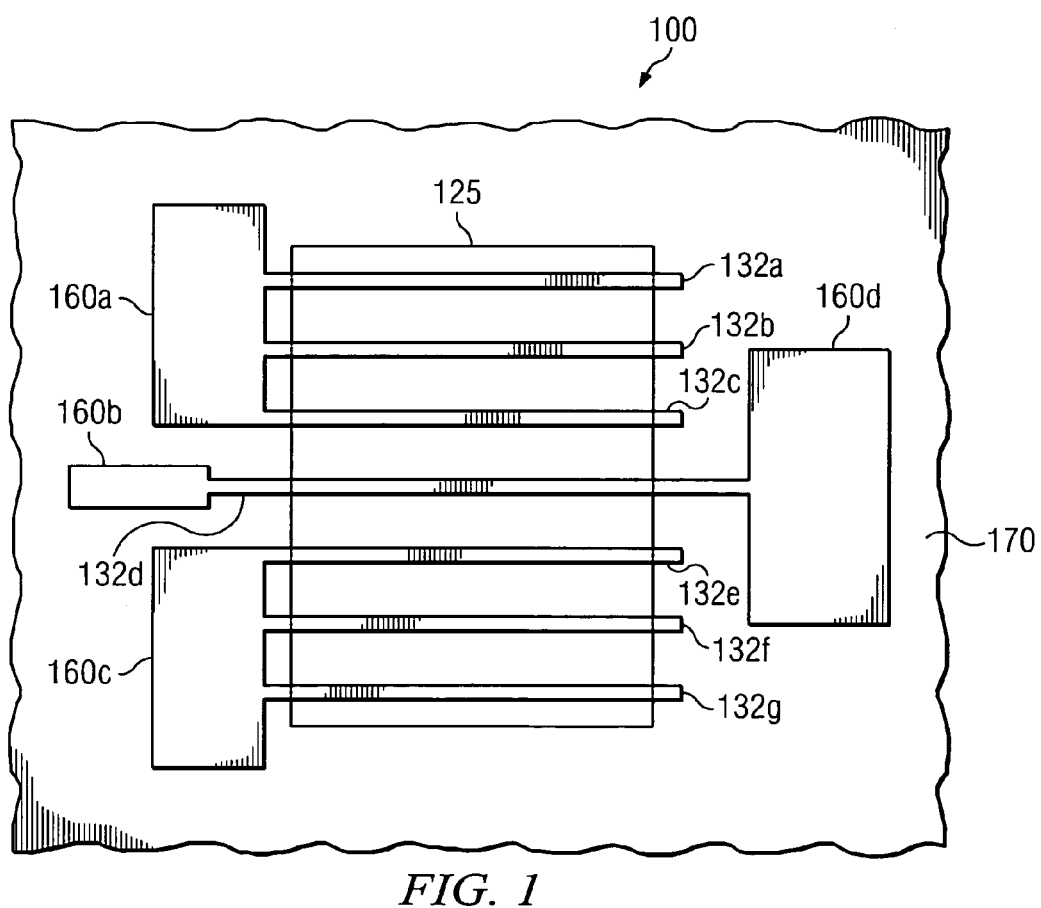
FIG. 1 depicts an exemplary device that can be made according to various embodiments of the invention.

Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Although reference is made herein to the use of the invention in the manufacture of semiconductor devices, such as ICs, it is to be understood that the invention has many other possible applications. For example, it may be employed in the manufacture of integrated optical systems, guidance and detection patterns for magnetic domain memories, liquid crystal display panels, thin-film magnetic heads, etc. Further, one of ordinary skill in the art will appreciate that, in the context of such alternative applications, any use of the term "wafer" in this text can be considered as being replaced by the more general terms "substrate".

In the present disclosure, the term "radiation" is used to include all types of electromagnetic radiation, including ultraviolet radiation (e.g., with a wavelength of, for example, 365, 248, 193, 157, or 126 nm), extreme ultraviolet radiation (e.g., with a wavelength of, for example in the range of 5 to 20 nm), and to include electrons. The term "beam" is used to encompass various types of beams including beams of radiation and beams of electrons.

The term mask, as used herein, can be broadly interpreted as referring to a layer of material used to pattern an underlying layer. A mask can be an inorganic material, for example, an insulator, such as, silicon oxide, silicon oxynitride (SiON), silicon rich nitride (SRN), TEOS, or a bottom anti-reflection coating (BARC), or other masking materials, or combinations thereof or another hardmask material.

The term feature, as used herein, can be broadly interpreted as referring to an element of a semiconductor device. Examples of a feature can include a gate, a gate bus, a well, an isolation structure, an interconnect line, a space, a contact hole, a pillar, a resistor, a ghost feature, or any other element of a semiconductor device or other device as will be understood by one of ordinary skill in the art. Features can be formed over a substrate. According to various embodiments, a feature can be formed in a mask and then transferred to an underlying layer.

The term ghost feature (also referred to herein as ghost polysilicon, ghost poly, ghost gate, or ghost poly gate), as used herein, can be broadly interpreted as referring to a structure used to improve the critical dimension control when forming semiconductor devices by removing or minimizing the differences in OPC and responses to process variations and are structures initially formed on or over substrate but later removed. In most cases, the ghost features are formed next to a feature that remains on the substrate. For example, a ghost feature, such as a ghost gate, can be formed at the end of a gate array so that the environment at the end of the gate array is similar to the environment in the interior of the gate array. Generally, the environment can include, for example, feature pitch and how well the printed feature size and/or shape conform to the intent of the original mask layout.

Ghost features can be used to reduce the critical dimension variation, such as, for example, for gates at the end of a gate array. For example, when using ghost gates, the critical dimension of gates at the end of the gate array (i.e., the last gate in an array for gates) can vary from about 0% to about 10% more than the critical dimension of gates in the interior of the array. This is a significant improvement over current methods that do not use ghost features, where features, such as the last gates in the array, may be 30% larger or smaller than the gates at the interior of the gate array. Moreover, because ghost features are removed from the wafer, they are not subject to further processing steps that include additional design restrictions and can lead to detrimental device interference.

Ghost features can be made of the same material as the other features concurrently formed. In the case of an array of gates made from a layer of polysilicon, for example, the ghost gate can be formed from the same layer of polysilicon. In other instances, however, where the layer is made of another material, such as a metal, a semiconductor, or an insulator, the ghost feature can be made of that material.

The term "over" as used herein can be broadly interpreted as referring to covering all or a portion of an underlying surface. Further, other surfaces may also be covered. The term "over" can also be understood to mean that there are intervening layers between the substrate and the layer over it.

The term substrate as used herein can be broadly interpreted to include any suitable material including but not limited to, for example, single crystalline silicon, sapphire, gallium arsenide, polycrystalline materials, insulators, metals, or the like. The substrate may contain various features and various layers.

According to various embodiments a computer readable medium can be used to generate at least a portion of the integrated circuit. The computer readable medium can comprise program code that can configure a processor to perform various steps used to make the integrated circuit.

FIGS. 1-5E' depict exemplary methods and devices according to various embodiments of the invention.

FIG. 1 shows an exemplary semiconductor device 100 that can be made using various embodiments of the invention. Semiconductor device 100 is an exemplary structure used herein to assist in describing the various embodiments of the invention. It is to be understood, however, that other semiconductor devices can be made using the various embodiments of the invention. Semiconductor device 100 can be formed over an active region (also called a well or moat) 125. The semiconductor device 100 can also comprise a plurality of features, such as, for example, a plurality of gate fingers 132a-132g, a plurality of gate busses 160a-160c, and a bond pad 160d. Also shown in FIG. 1 is a field region 170.

According to various embodiments, there is a method of making a semiconductor device. The method can comprise forming a first layer over a semiconductor substrate. The first layer can comprise, for example, polysilicon or an insulator. A first mask layer is then formed over the semiconductor substrate. The first mask layer can comprise, for example, an inorganic material, such as an insulator material, such as silicon oxide, silicon oxynitride (SiON), silicon rich nitride (SRN), TEOS, or a bottom anti-reflection coating (BARC), or other masking materials, or combinations thereof. A first organic material, such as a photoresist can be deposited over the first mask layer. As will be understood by one of ordinary skill in the art, the first photoresist can be patterned by exposure to a beam and developing. The pattern of the first photoresist layer can then be transferred to the first mask layer. The first mask layer, now being patterned, can be used to pattern first features on the semiconductor substrate, or in the first layer. According to various embodiments, the first features can comprise gates and ghost features.

A second mask layer can then be formed over the first features. The second mask layer can comprise, for example, an inorganic material, such as an insulator material, such as silicon oxide, silicon oxynitride (SiON), silicon rich nitride (SRN), TEOS, or a bottom anti-reflection coating (BARC), or other masking materials, or combinations thereof. The second mask layer can have a different etch rate than that of the first mask layer. A second organic material, such as a photoresist can be deposited over the second mask layer. As will be understood by one of ordinary skill in the art, the second photoresist can be patterned by exposure to a beam and developing. The pattern of the second photoresist layer can then be transferred to the second mask layer. Moreover, the pattern in the second mask layer can be used to pattern portions of the first features, the first mask layer, the first layer, or to form second features. For example, the second mask layer can be used to pattern portions of the first features, such as by completely removing first features or it can be used to remove portions of, or trim the first features. According to various embodiments, patterning portions of the first features can also allow second features to contact first features.

Generally, this dual mask process enables patterning of structures that cannot be patterned using a single mask. For example, structures with smaller pitches or smaller spaces can be patterned than would be possible using a single mask. Further, by using two masks, different physical mask characteristics can be exploited to trim or grow the size of the features patterned by one mask, independent of the features patterned by the other mask. Further, by using two masks, different etching processes can be employed to trim or grow the size of the features patterned by one mask, independent of the features patterned by the other mask. Also, by using two masks, a feature patterned using the first mask can be removed using the second mask, enabling tighter pitches or smaller structures than would be possible if the feature patterned by the first mask were not removed.

For example, a first mask layer can be formed on a substrate, which may have a poly layer on the surface, and a first photoresist layer can be formed and patterned over the first mask layer. In certain embodiments, the pattern defines gates that extend over the active regions of the device to the field regions. A first etch may transfer the pattern of the first photoresist through the first mask to define features, such as gates, that can extend over the active areas to the field areas but may not significantly etch the underlying material, such as poly, which will ultimately form the features. A second mask can be patterned using, for example, a second photoresist to mask underlying regions. For example, the patterned second mask layer can mask portions of the first mask layer or exposed poly over the active areas or over the field areas where the first mask has already been removed. Thus, areas masked by the first mask may also be masked by the second mask. After the second mask layer is opened, a single etch can be used to define the full layout of the underlying material, such as to form gates in poly.

According to various embodiments, there may be areas with overlapping first mask and second mask patterns due to a possible need for alignment margin connection for patterns. At a later step, a plasma dry strip or post-etch wet strip can be used to remove both masks.

Figure 2A:
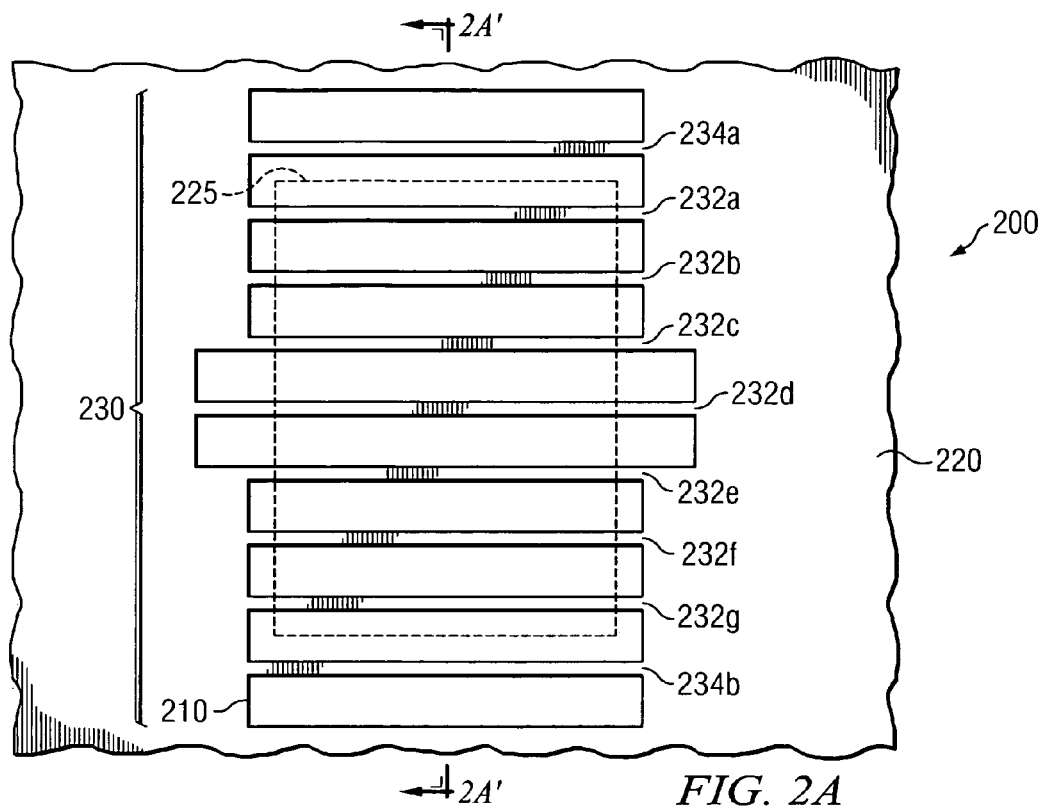
FIGS. 2A-2D depict top down views of various steps in an exemplary process of making a semiconductor device according to various embodiments of the invention.
Figure 2A:
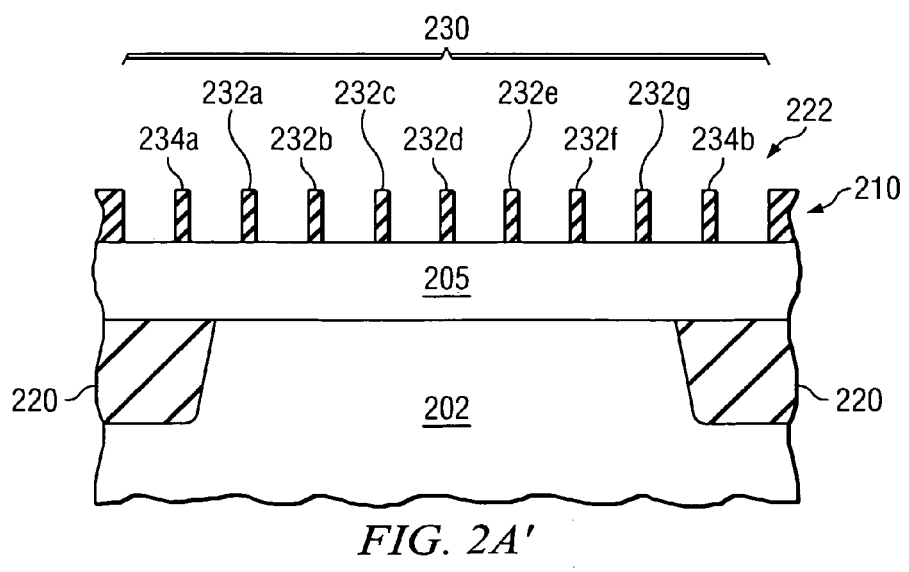
Figure 2B:
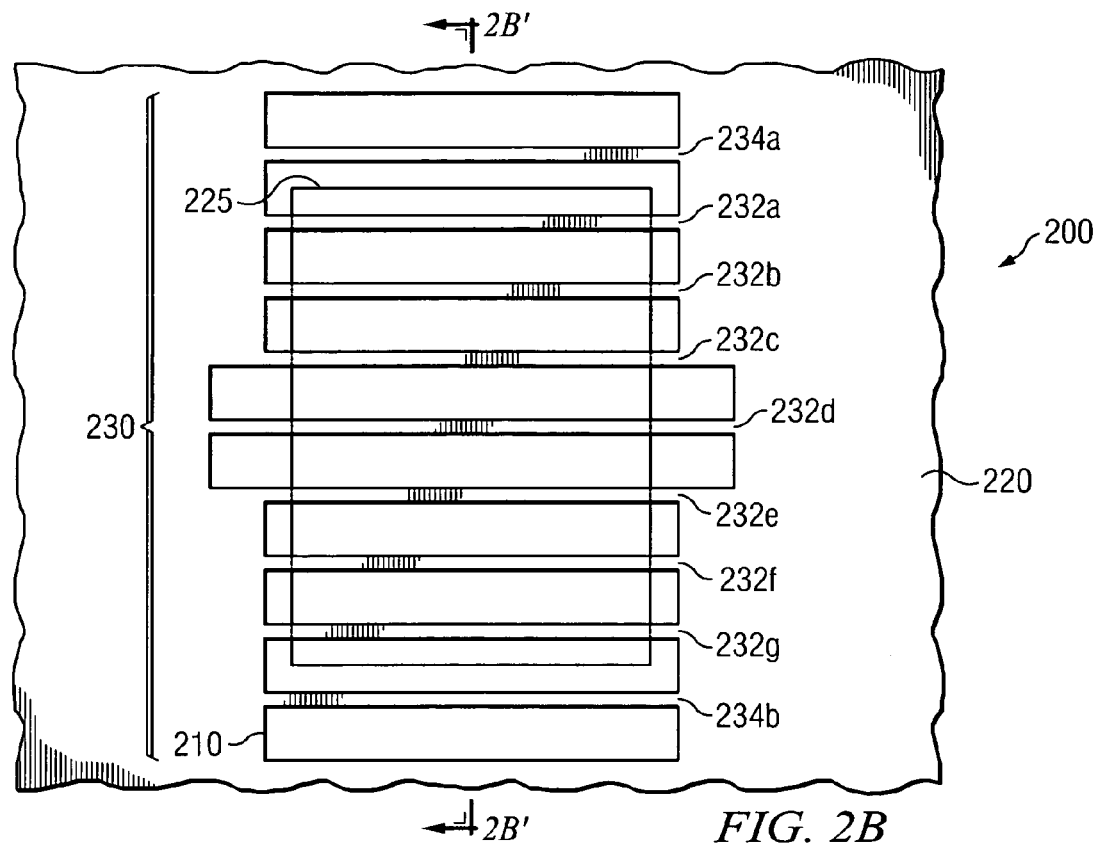
Figure 2B:
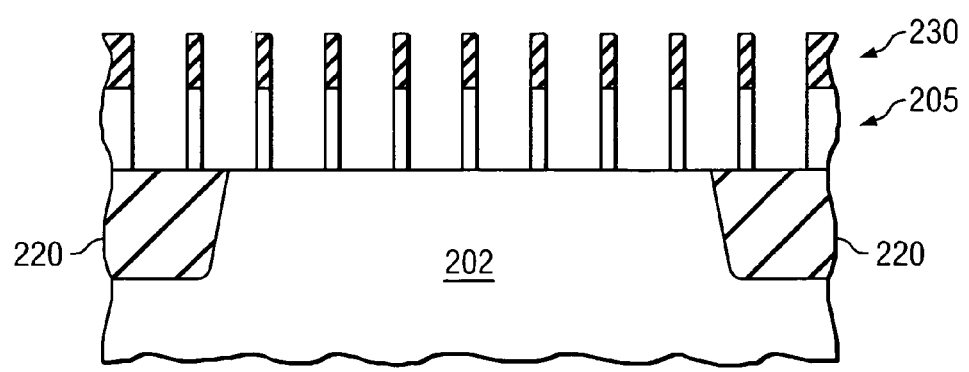
Figure 2C:
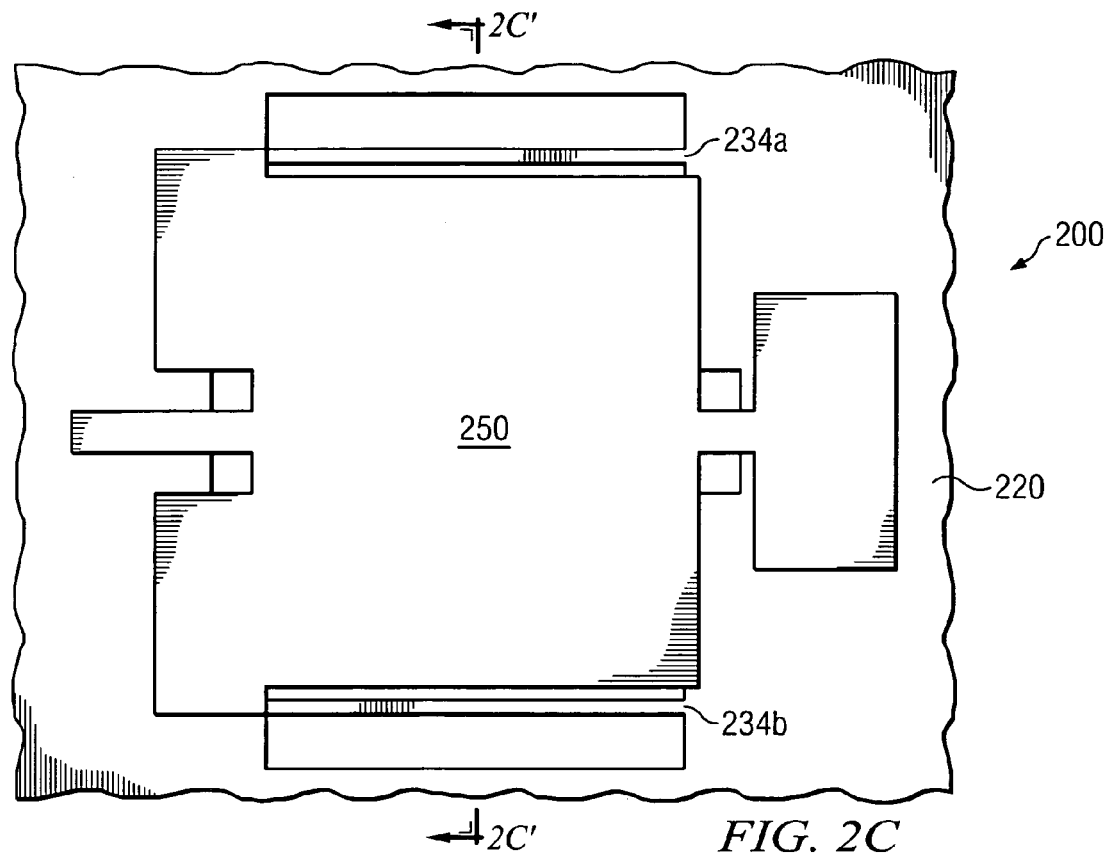
Figure 2C:
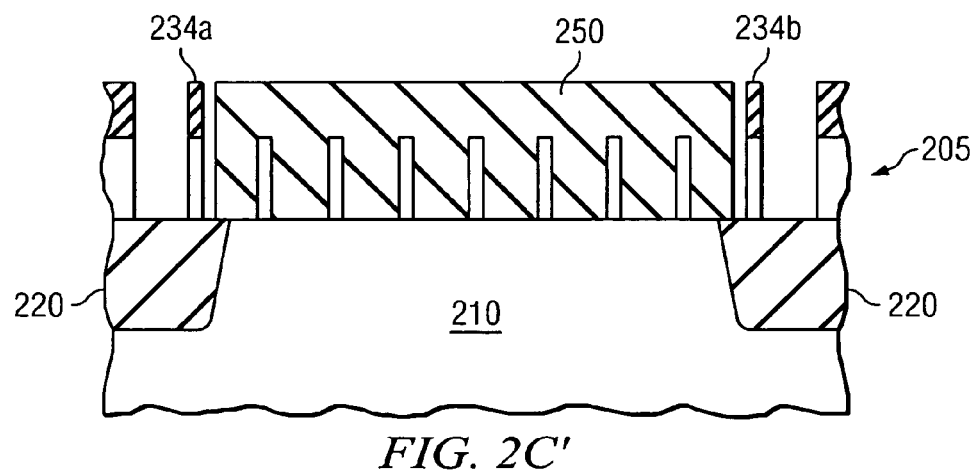
Figure 2D:
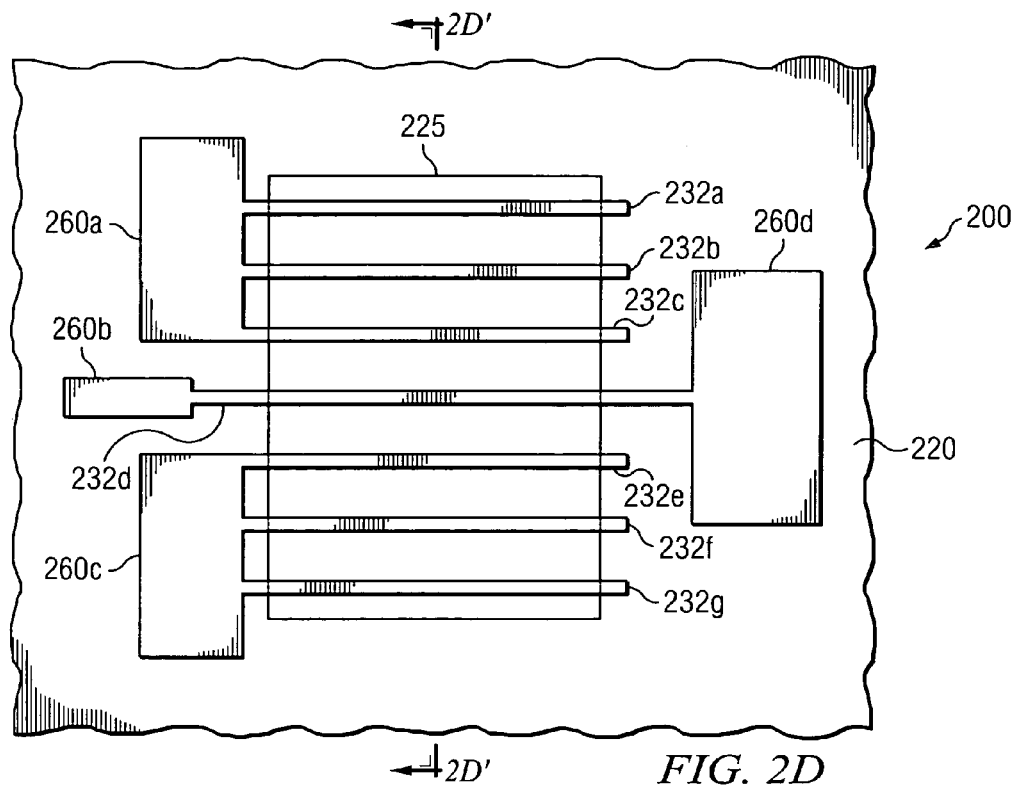
Figure 2D:
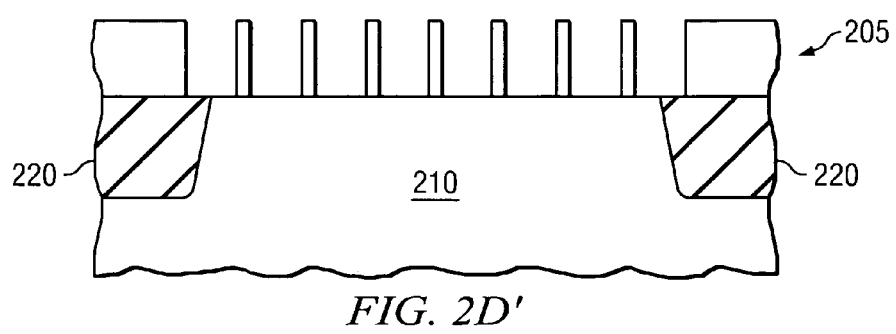

FIGS. 2A-2D and FIGS. 2A'-2D' depict various steps in an exemplary process of making a semiconductor device 200 according to various embodiments of the invention. FIGS. 2A-2D depict top down views of the method and device and FIGS. 2A'-2D' depict respective cross-sectional views taken along respective section lines 2A'-2A' through 2D'-2D'. For example, in FIG. 2A and FIG. 2A' a first layer 205, such as polysilicon, is deposited over a semiconductor substrate 202 comprising a moat 225. FIG. 2A and FIG. 2A' also show a first mask layer 210 deposited and patterned over the first layer 205 forming features 230, such as features 232a-232g and 234a-234b. In FIG. 2B and FIG. 2B' the first layer 205 (e.g., polysilicon) is etched through the holes 222 in the first mask 210 to expose the substrate 202 and moat 225. The first mask layer 210 is stripped, and a second mask layer 250 is patterned using photolithography as shown in FIG. 2C and FIG. 2C'. The second mask layer 250 can be opened by a plasma etch. The first layer 205 (e.g., polysilicon) is then etched, using the second mask 250 to define the pattern. The second mask 250 serves both to define new features, such as 260a-260d, in the first layer, and to cover and protect features formed by the first mask and etch. The final structure after etching the first layer down to the field oxide and moat is illustrated in FIG. 2D and FIG. 2D'.

According to various embodiments, the first mask layer 210 can comprise SRN and the second mask layer can comprise BARC. In other embodiments, however, the first mask layer 210 and the second mask layer 250 can comprise, for example, an insulator material, such as silicon oxide, silicon oxynitride (SiON), silicon rich nitride (SRN), TEOS, or a bottom anti-reflection coating (BARC), or other masking materials, or combinations thereof. According to various embodiments, the first mask layer 210 can have a different etch rate or etch chemistry than the second mask layer 250.

Photoresist (not shown) can be used to pattern the masks. For example, a photoresist can be deposited over a mask layer and, as will be understood by one of ordinary skill in the art, the photoresist is patterned by exposure to a beam and developing. The pattern from the photoresist is transferred to the mask layer by, for example, etching. Similarly, the pattern of the second mask layer 250 and the first mask layer 210 can be used to form first features 230 in the first layer 205. While not intending to be limited to any particular features, the first features 230 can include, for example, an array of gates 232a-232g and ghost gates 234a and 234b formed adjacent to the end gates 232a and 232g of the array of gates. According to various embodiments, the first features 230 can be formed by, for example, etching. Etching can include, for example, plasma etching using HBr, Cl₂, and hydrofluorocarbon gases at pressures between 1 and 100mT, in inductively coupled, capacitively coupled, or electron cyclotron resonance generated plasmas.

According to various embodiments, the second mask layer 250 can comprise BARC. In other embodiments, however, the first mask layer 210 and the second mask layer 250 can comprise, for example, an insulator material, such as silicon oxide, silicon oxynitride (SiON), silicon rich nitride (SRN), TEOS, or a bottom anti-reflection coating (BARC), or other masking materials, or combinations thereof.

The second mask 250 can allow the ghost gates 234a and 234b and the field region of the first layer to remain exposed. Still further, the second mask 250 can form patterns that eventually will be patterned into underlying layers. Moreover, the ghost gates 234a and 234b can be removed from the substrate 202 as well as a portion of the first layer 205 (e.g., polysilicon) to expose a field region 220 shown in FIGS. 2B-2D. Because the ghost gates 234a and 234b are made of the same material as first layer 205 (e.g., polysilicon), they can be removed using the same etch that is used to remove excess first layer material.

Figure 3A:
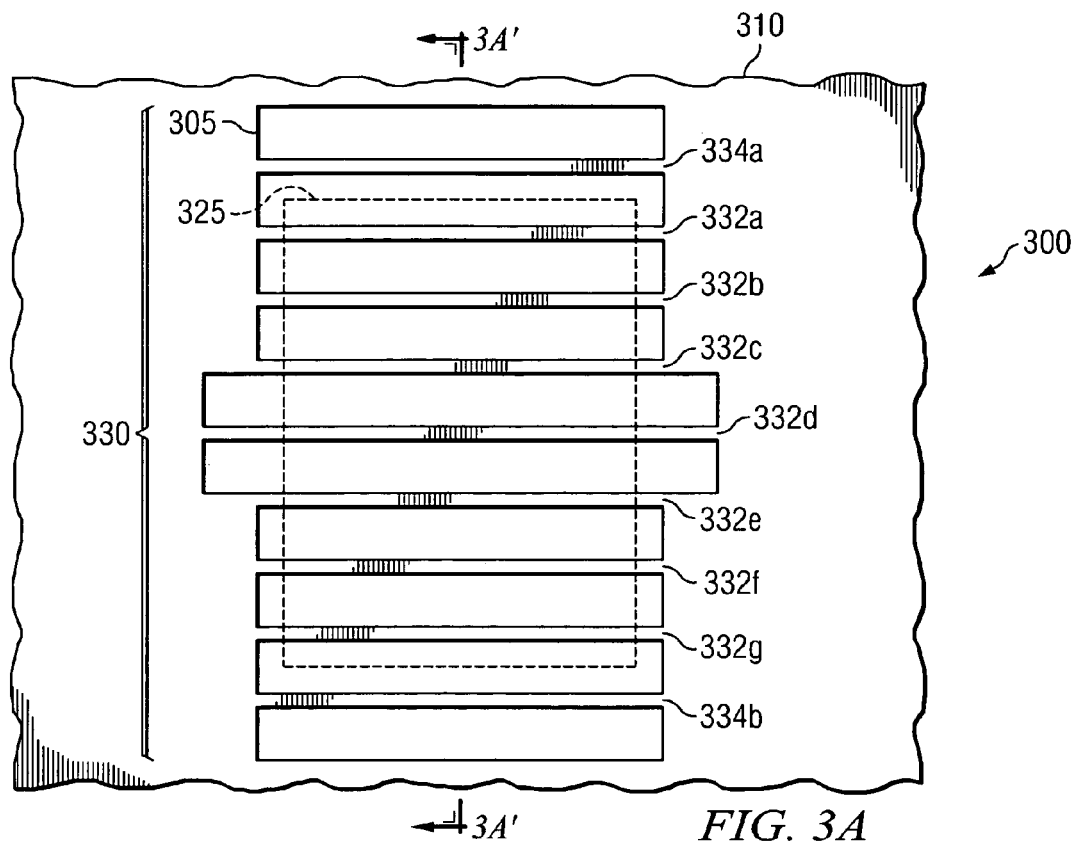
FIGS. 3A-3D depict top down views of various steps in another exemplary process of making a semiconductor device according to various embodiments of the invention.
Figure 3A:
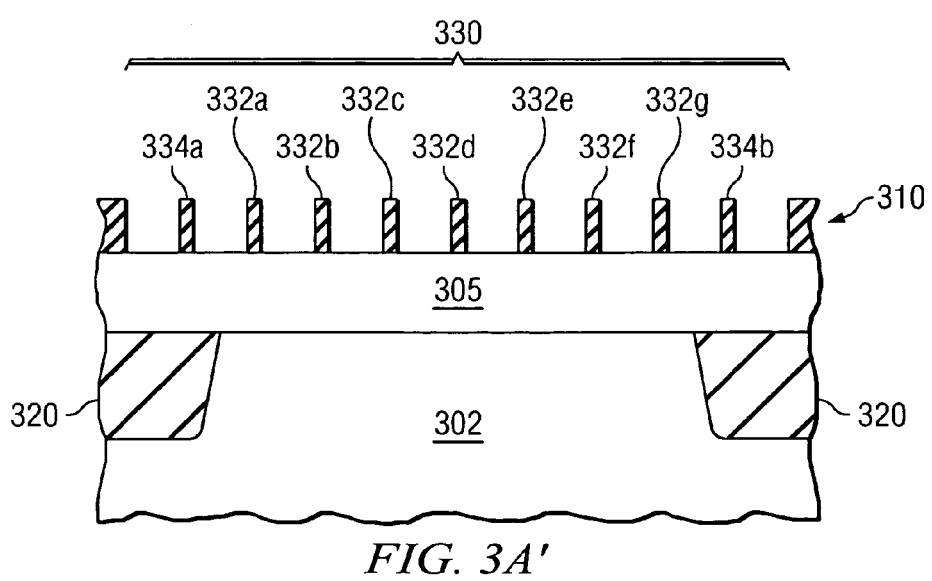
Figure 3B:
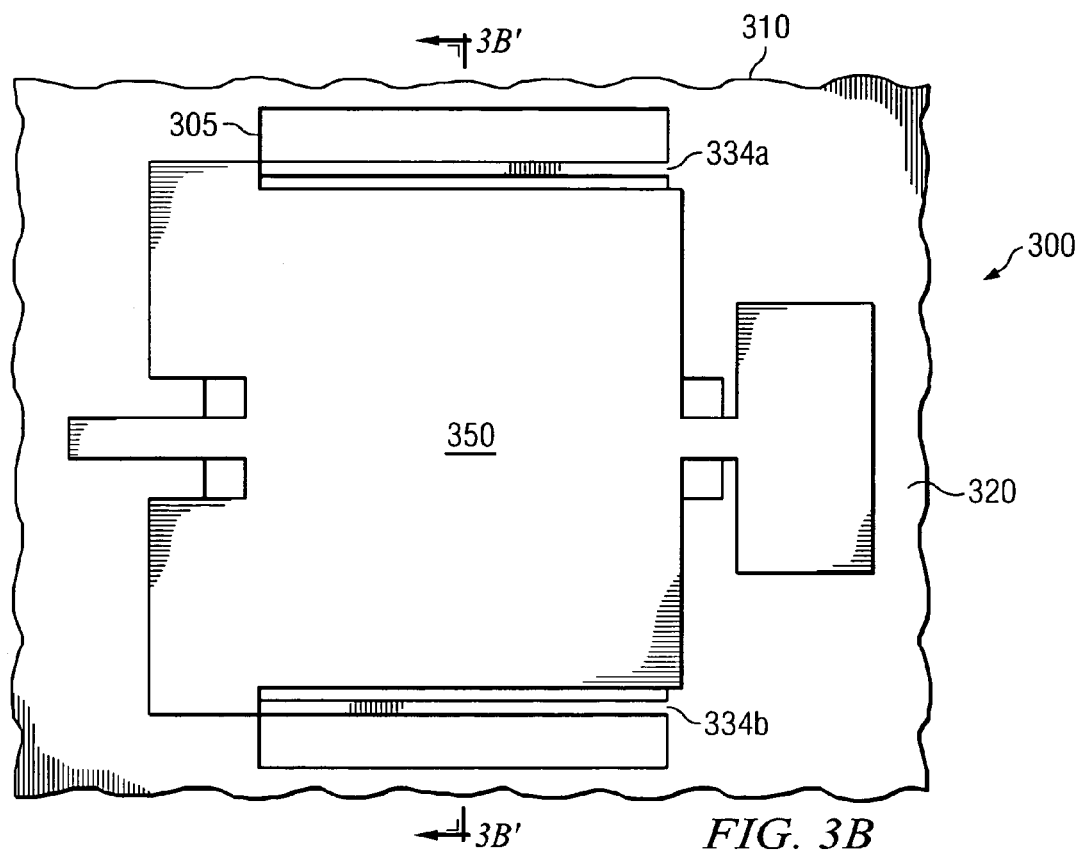
Figure 3B:
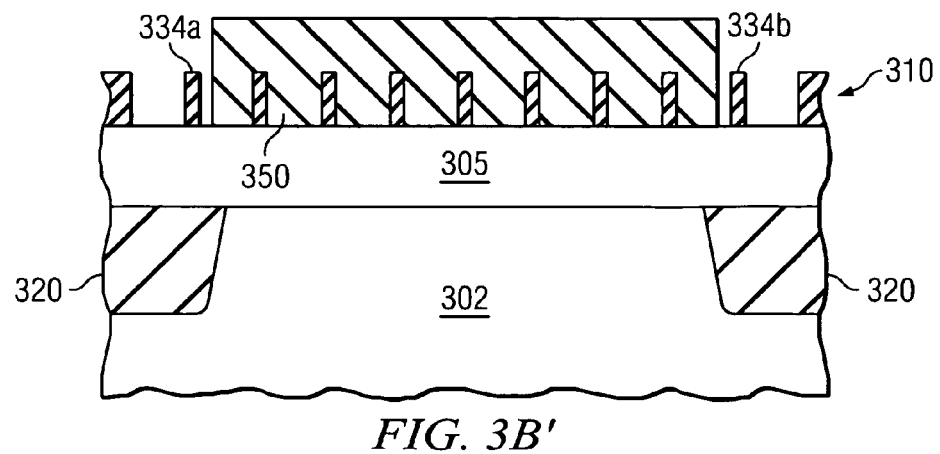
Figure 3C:
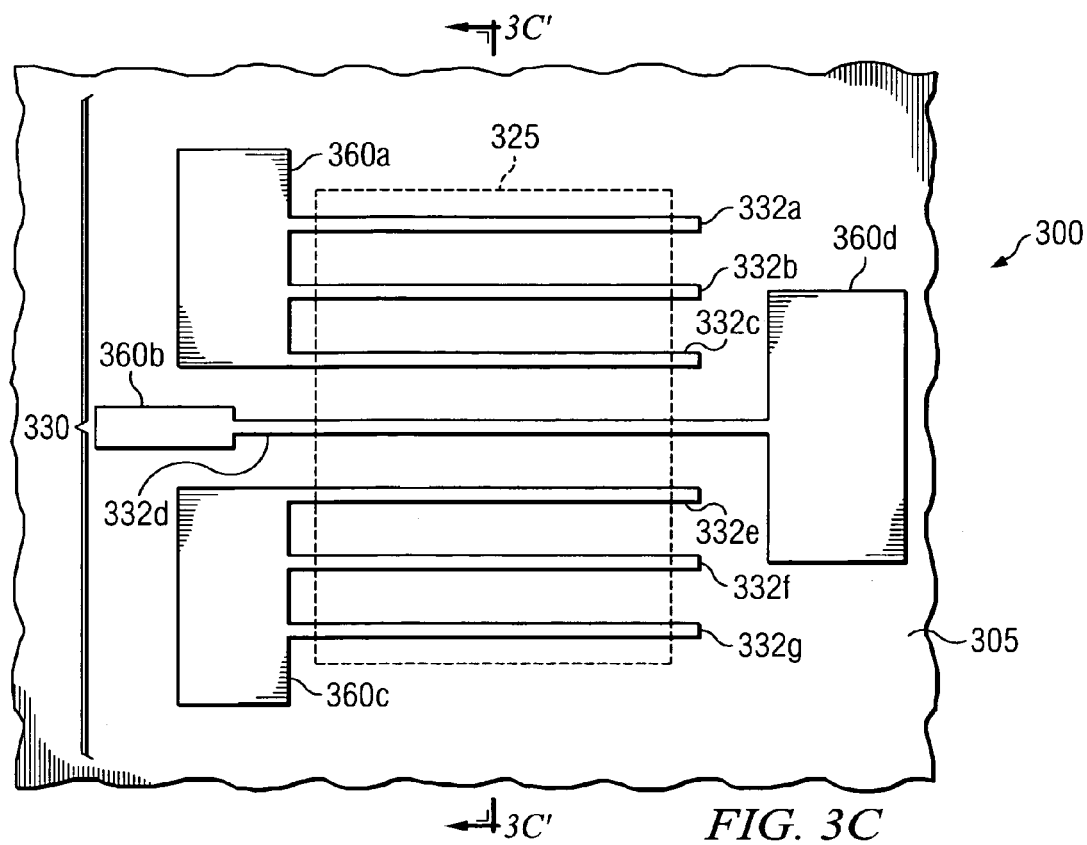
Figure 3C:
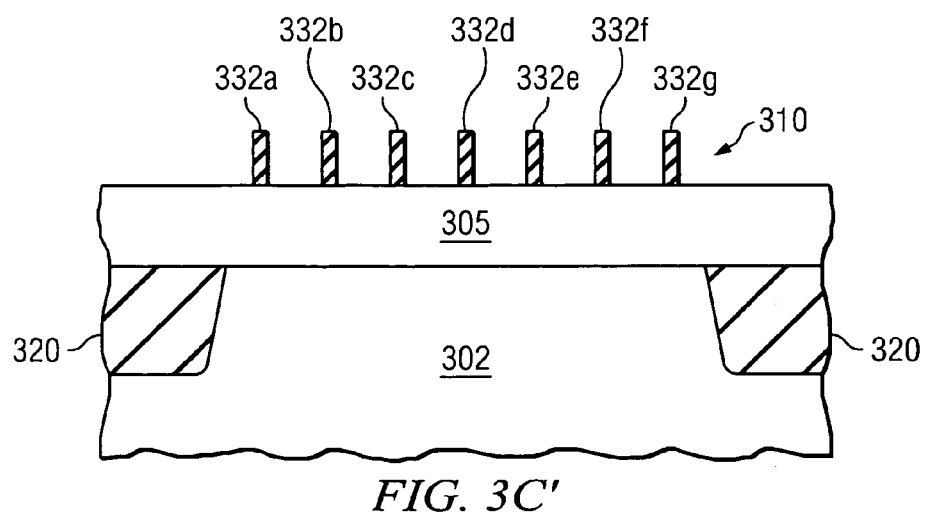
Figure 3D:
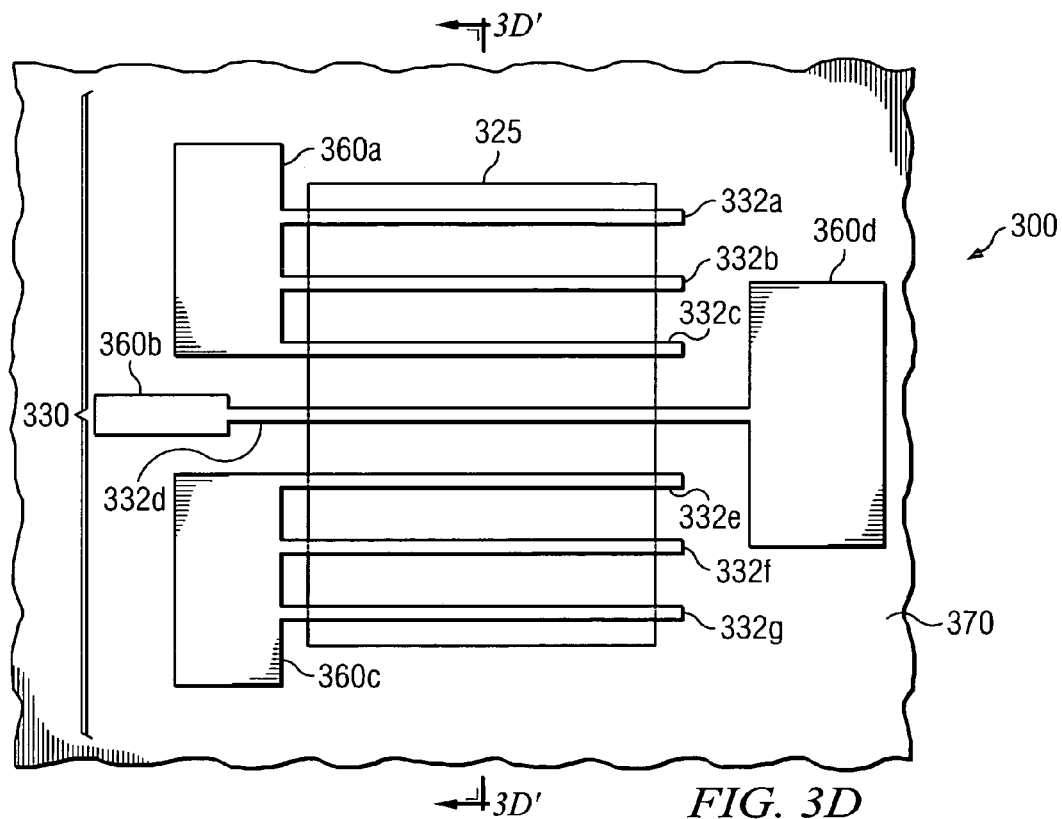
Figure 3D:
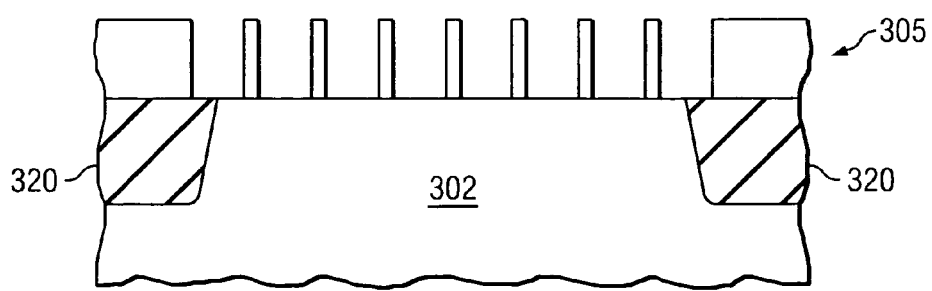

FIGS. 3A-3D and FIGS. 3A'-3D' depict various steps in another exemplary process of making a semiconductor device according to various embodiments of the invention. FIGS. 3A- 3D depict top down views of the method and device and FIGS. 3A'-3D' depict respective cross-sectional views taken along respective section lines 3A'-3A' through 3D'-3D'. Note that the final device in FIG. 3D is similar to the final device in FIG. 2D, only the fabrication steps are different. For example, in FIG. 3A and FIG. 3A' a first layer 305, such as polysilicon, is deposited over a semiconductor substrate 302 comprising a moat 325 and a first mask layer 310 is deposited over the first layer 305. This first mask layer 310 is coated with photoresist (not shown) and patterned with photolithography. The first mask layer 310 is then plasma etched to expose portions of the first layer 305 forming features 330, such as features 332a-332g and 334a-334b, followed by strip of the resist. This is the situation depicted in FIG. 3A and FIG. 3A'. A second mask layer 350 (e.g., BARC) is then deposited. The second mask layer 350 is patterned using photolithography, with the BARC opened using a plasma etch. This is the situation depicted in FIG. 3B and FIG. 3B', where the second mask layer 350 covers some areas of the first layer 305 and the first mask 310. A plasma etch is used to transfer the second mask pattern onto the first mask, and then the second mask is removed by a wet or plasma strip. This is shown in FIG. 3C and FIG. 3C', where the final structure has been patterned into the first mask above the first layer 305. The first layer 305 (e.g., polysilicon) is then etched down to the substrate 310 and moat 325, followed by wet or plasma strip of the first mask. Thus the final structure shown in FIG. 3D and FIG. 3D' is formed.

In some embodiments, an insulator can be deposited over the substrate prior to depositing the first mask layer 310. Moreover, an active region (also called a moat and shown as region 325 in FIG. 3D and FIG. 3D') can be formed under a portion of the first layer 305. According to various embodiments, the first mask layer 310 can comprise SiON. In other embodiments, the first mask layer 310 can comprise for example, an insulator material, such as silicon oxide, SRN, TEOS, or a BARC, or other masking materials, or combinations thereof.

While not intending to be limited to any particular features, the first features 330 can include, for example, an array of gates 332a-332g and ghost features 334a and 334b formed adjacent to the end gates 332a and 332g. According to various embodiments, the first features can be formed by, for example etching.

According to various embodiments, the second mask layer 350 can comprise BARC. In other embodiments, the second mask layer 350 can comprise for example, an insulator material, such as silicon oxide, SRN, TEOS, SiON, or other masking materials, or combinations thereof.

After the second mask layer 350 in FIG. 3B and FIG. 3B' has been patterned, a portion of the first features 330, a portion of the first mask layer 310, and a portion of the first layer 305 can remain exposed. For example, the second mask layer 350 can allow the ghost features 334a and 334b and the field region 320 of the first layer 305 to remain exposed. Still further, the second mask layer 350 can form patterns that will eventually be patterned into underlying layers.

Subsequently, as shown in FIG. 3C and FIG. 3C', the second mask layer 350 can be used to pattern second features 360a-360d, such as gate busses and bond pads, over the semiconductor substrate 302. Moreover, the ghost features 334a and 334b have been removed from the wafer. Because the ghost features 334a and 334b are made of the same material as the first mask layer 310, they can be removed at the same time as the exposed first mask layer 310.

Figure 4A:
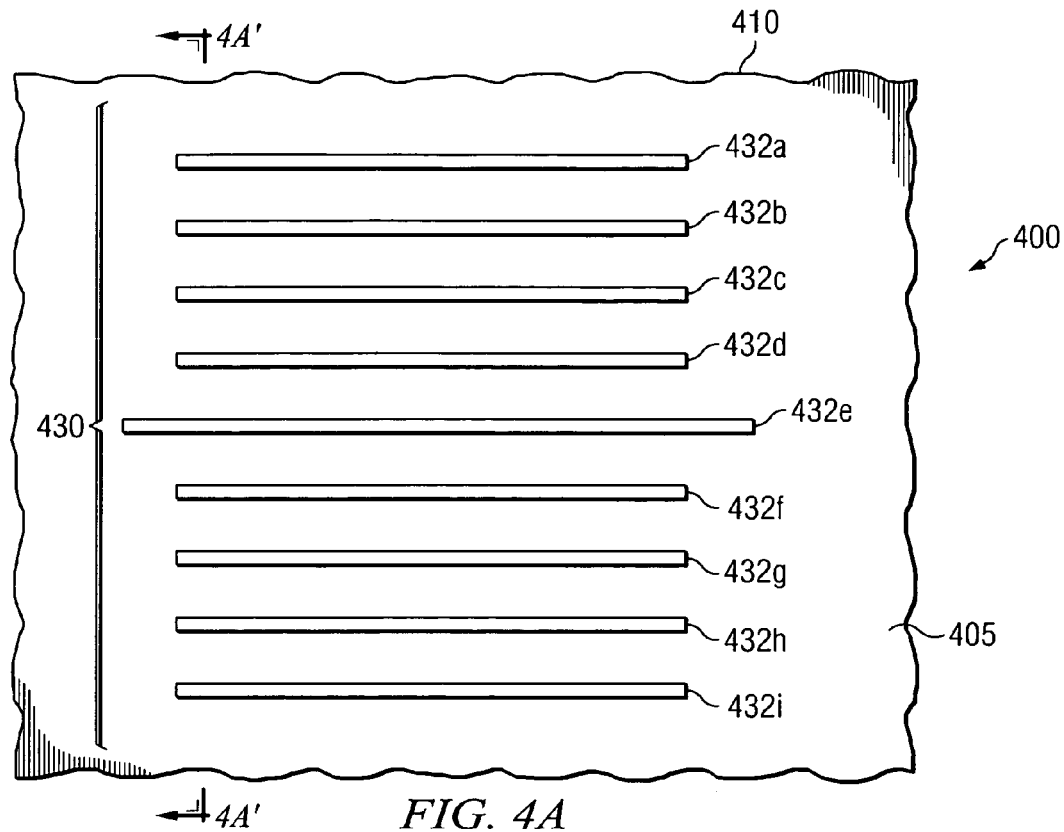
FIGS. 4A-4D depict top down views of various steps in another exemplary process of making a semiconductor device according to various embodiments of the invention.
Figure 4A:
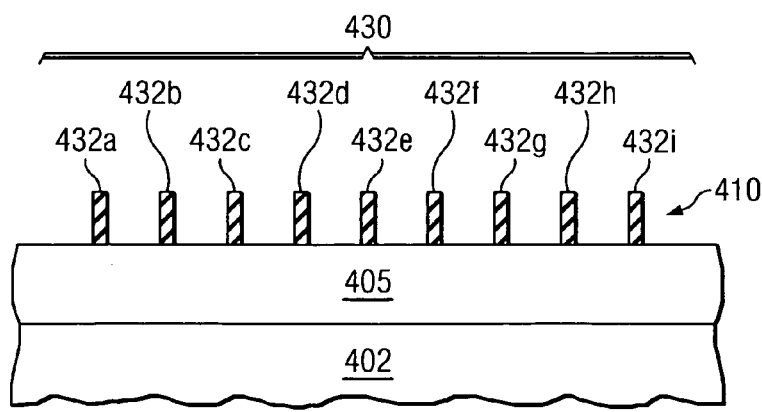
Figure 4B:
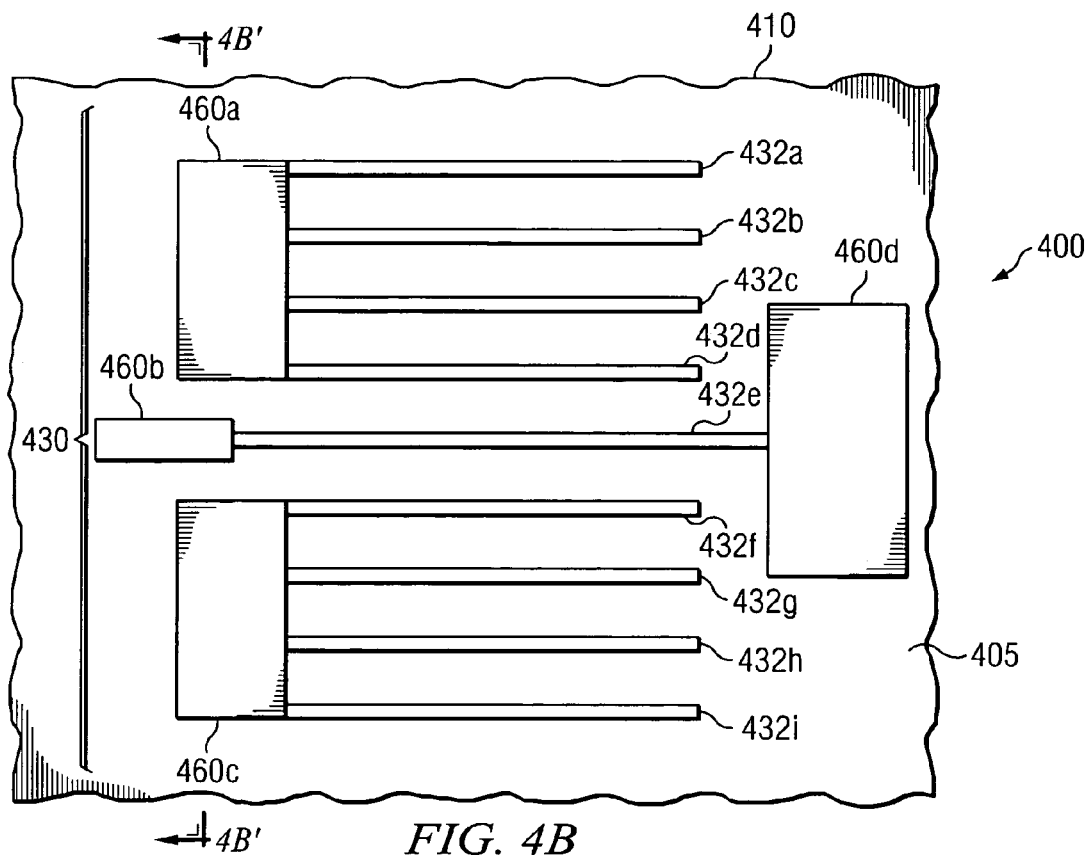
Figure 4B:
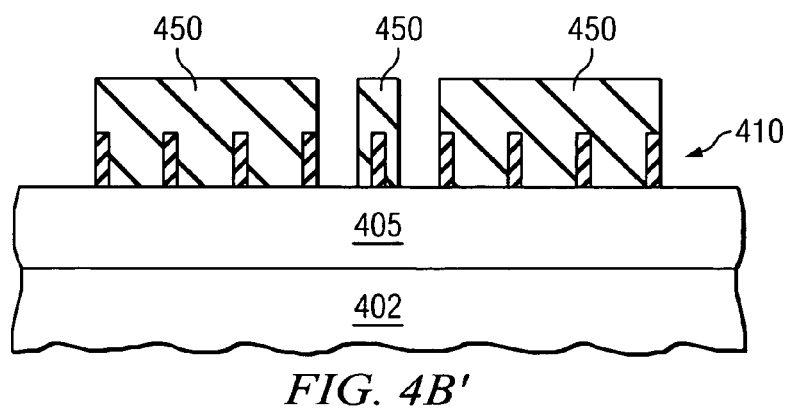
Figure 4C:
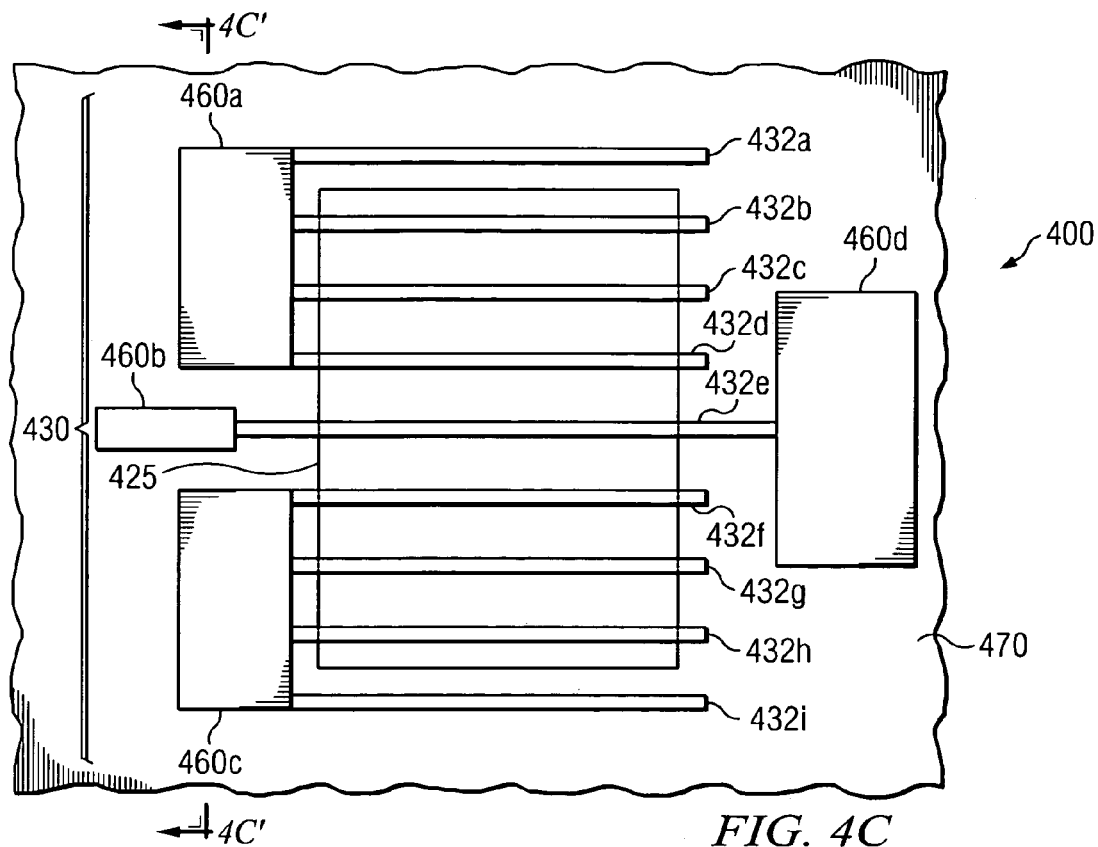
Figure 4C:
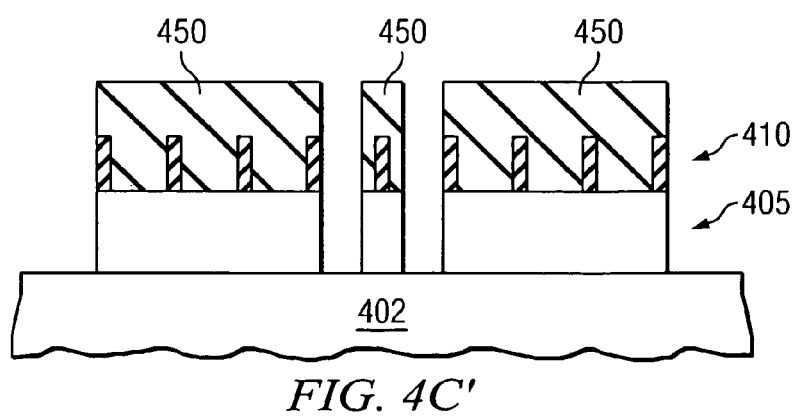
Figure 4D:
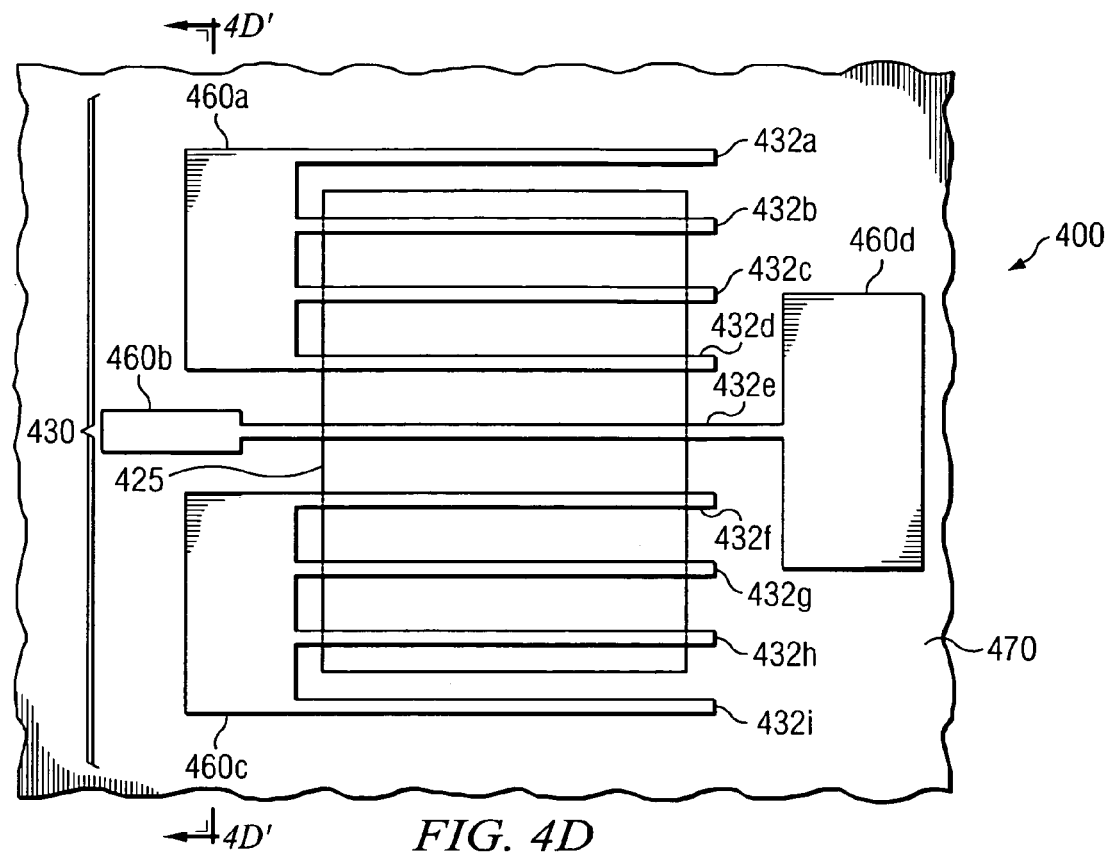
Figure 4D:
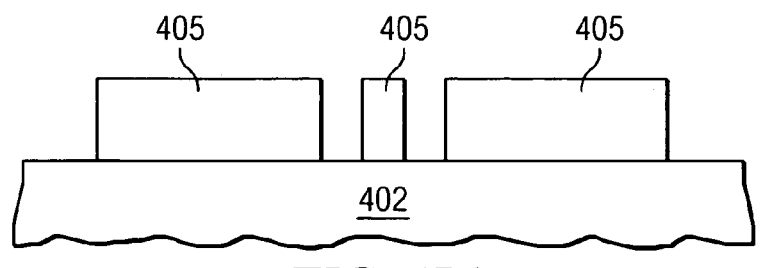

FIGS. 4A-4D and FIGS. 4A'-4D' depict various steps in another exemplary process of making a semiconductor device according to various embodiments of the invention. FIGS. 4A-4D depict top down views of the method and device and FIGS. 4A'-4D' depict respective cross-sectional views taken along respective section lines 4A'-4A' through 4D'-4D'. Note that the final device in FIG. 4D is similar to the final device in FIG. 2D, only the fabrication steps are different.

For example, in FIG. 4A a first layer 405, such as polysilicon, is deposited over a semiconductor substrate 402 comprising a moat 425 and a first mask layer 410 is deposited over the first layer 405. This first mask layer 410 is coated with resist and patterned with photolithography. The first mask layer 410 is then plasma etched to expose the first layer 405, followed by strip of the resist thereby forming first features 432a-432i. This is the situation depicted in FIG. 4A and FIG. 4A'.

A second mask layer 450 (e.g., BARC) is then deposited over the structure. The second mask layer 450 is patterned using photolithography with the BARC opened using a plasma etch. This is the situation depicted in FIG. 4B and FIG. 4B' where the second mask layer 450 covers some areas of the first layer 405 and slightly overlaps the first mask 410. A plasma etch is used to transfer the first and second mask patterns into the first layer 405 (e.g., polysilicon) as shown in FIG. 4C and FIG. 4C'. The first and second masks, are then removed by a wet or plasma strip, leaving the final structure in first layer as shown in FIG. 4D and FIG. 4D'.

According to various embodiments, the first mask layer 410 can comprise SiON. In other embodiments, the first mask layer 410 can comprise for example, an insulator material, such as silicon oxide, SRN, TEOS, or a BARC, or other masking materials, or combinations thereof. A first photoresist (not shown) can be deposited over the first mask layer 410, and as will be understood by one of ordinary skill in the art, the first photoresist can be patterned by exposure to radiation and developing.

The pattern from the first photoresist can be transferred to the first mask layer 410, for example, by etching. While not intending to be limited to any particular features, the first features 430 can include, for example, an array of gates 432a-432i. According to various embodiments, the first features can be formed by, for example etching. Subsequently, any remaining first photoresist can be removed.

According to various embodiments, the second mask layer 450 can comprise BARC. In other embodiments, the second mask layer 450 can comprise for example, an insulator material, such as silicon oxide, SRN, TEOS, SiON, or other masking materials, or combinations thereof. A second photoresist (not shown) can be deposited over the second mask layer 450, and as will be understood by one of ordinary skill in the art, the second photoresist can be patterned by exposure to a beam and developing.

FIG. 4D shows first features 432a-i and 460a-d comprising poly and formed over the substrate 410. First features 432a-d form gate fingers that contact second feature 460a. Similarly, .first feature 432e forms a gate line and contacts second features 460b and 460d. Still further, first features 432f-i form gate fingers that contact second feature 460c.

Figure 5A:
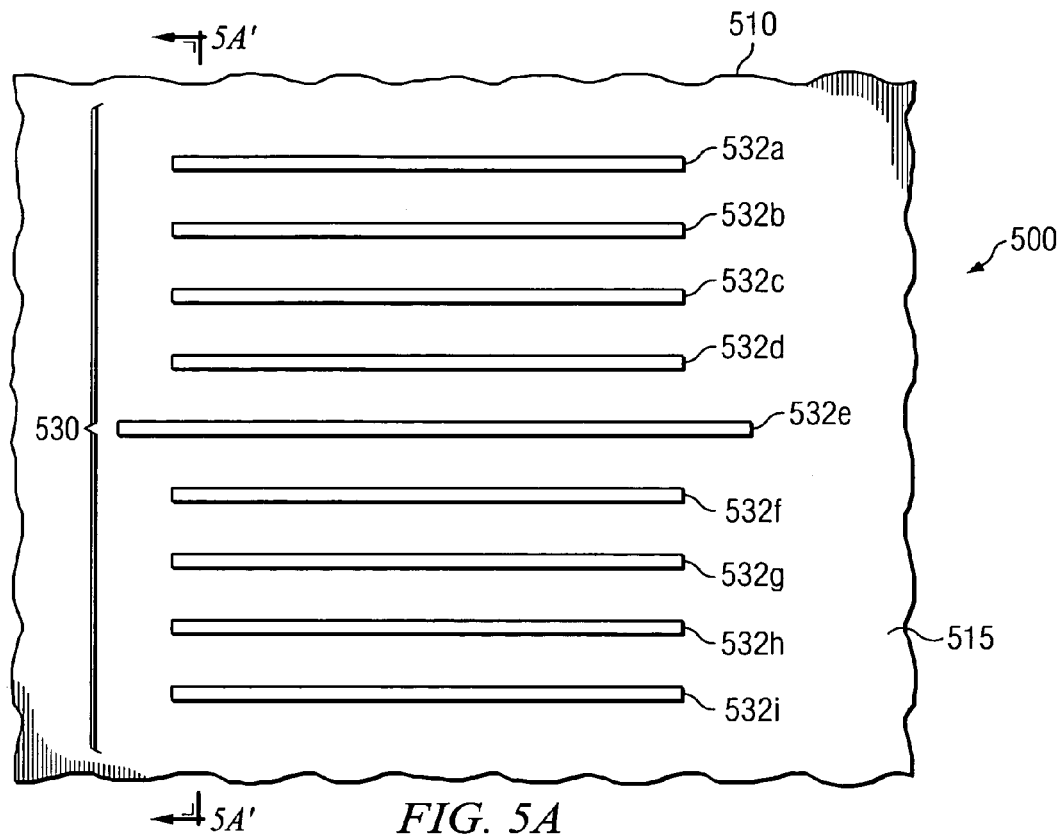
FIGS. 5A-5E depict top down views of various steps in another exemplary process of making a semiconductor device according to various embodiments of the invention.
Figure 5A:
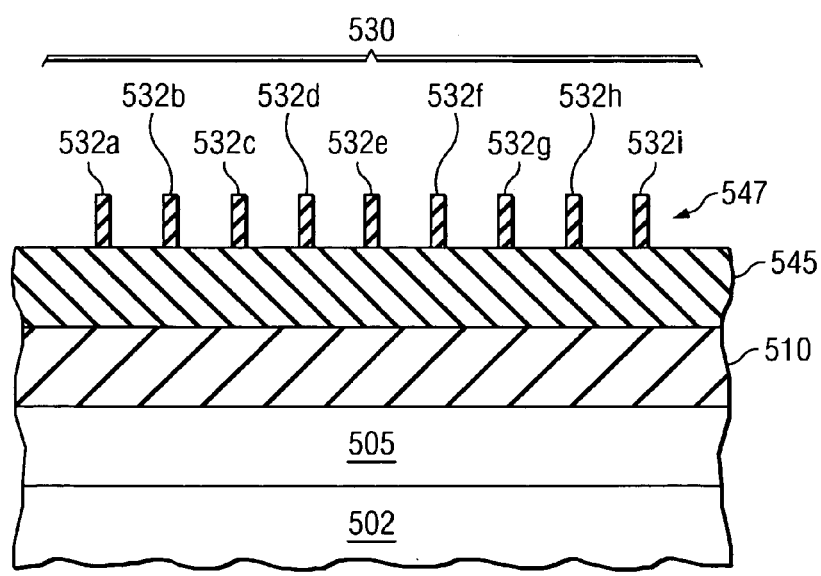
Figure 5B:
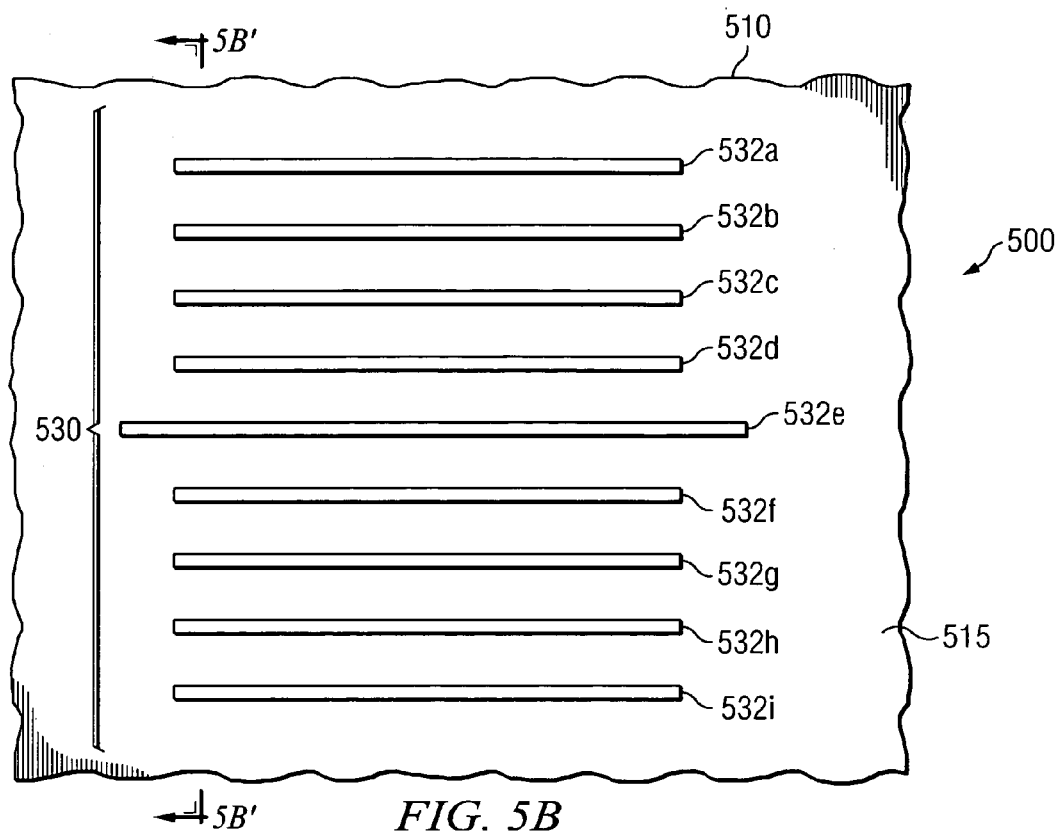
Figure 5B:
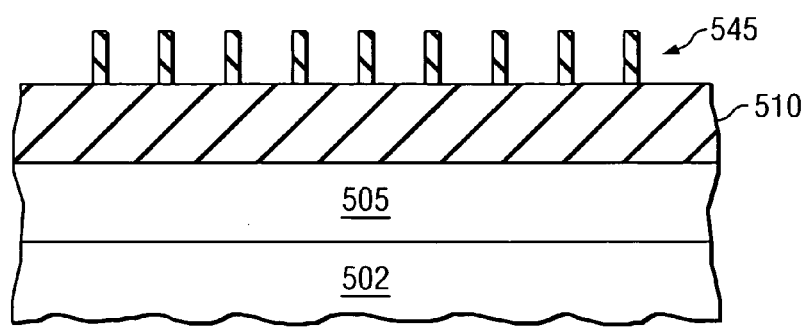
Figure 5C:
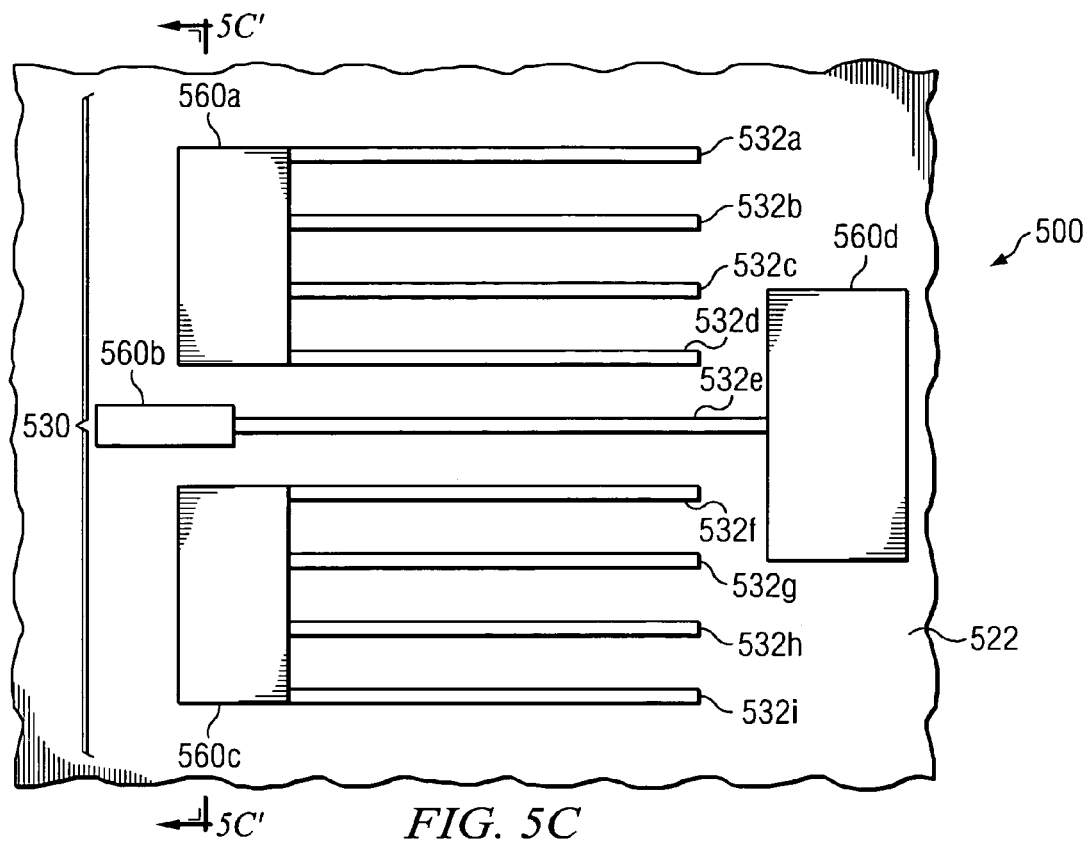
Figure 5C:
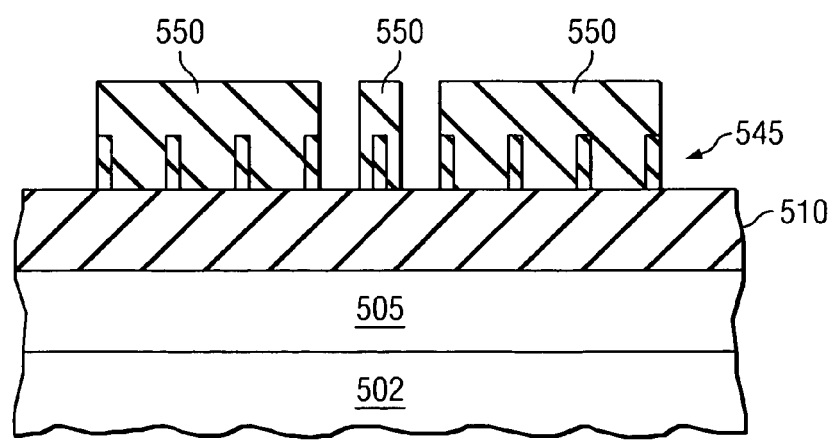
Figure 5D:
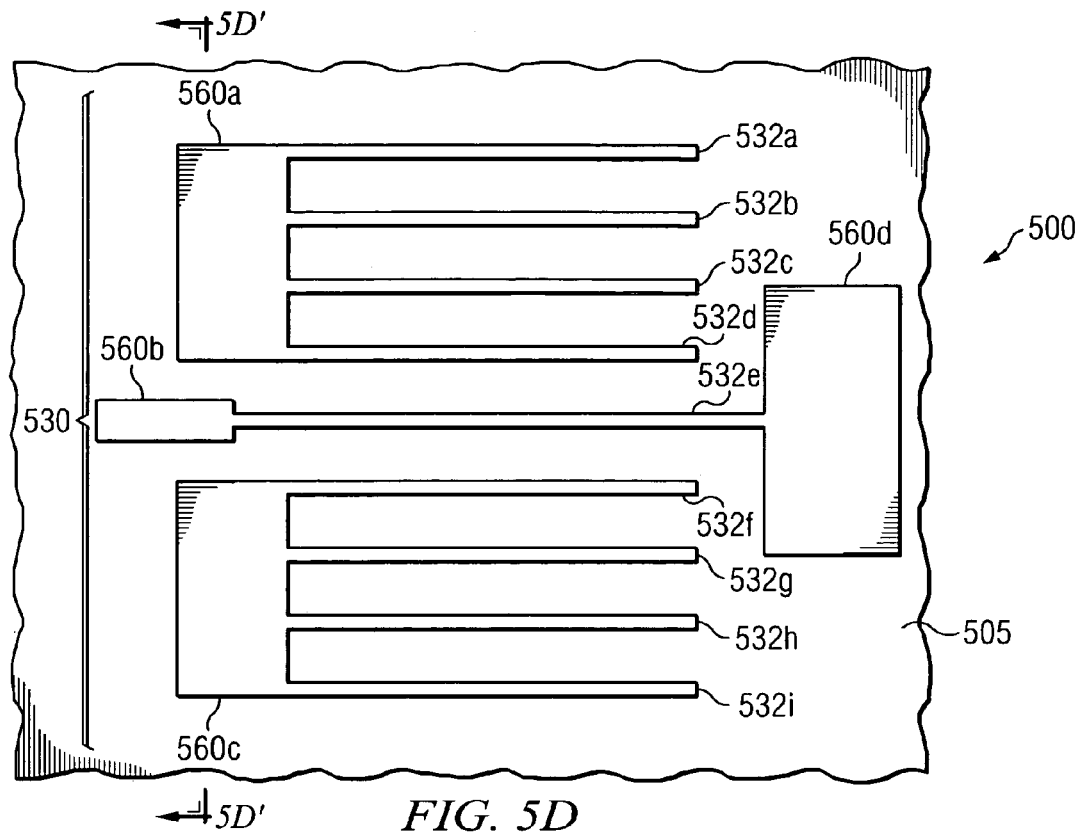
Figure 5D:
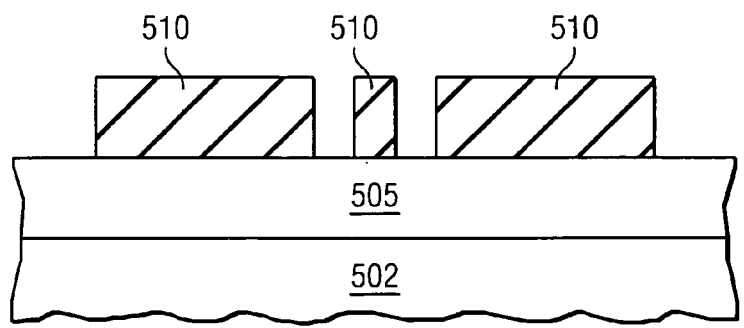

FIGS. 5A-5D and FIGS. 5A'-5D' depict various steps in another exemplary process of making a semiconductor device according to various embodiments of the invention. FIGS. 5A-5D depict top down views of the method and device and FIGS. 5A'-5D' depict respective cross-sectional views taken along respective section lines 5A'-5A' through 5D'-5D'. Note that the final device in FIG. 5D is similar to the final device in FIG. 2D, only the fabrication steps are different.

For example, in FIG. 5A and FIG. 5A' a first layer 505, such as polysilicon, is deposited over a semiconductor substrate 502 and a first mask layer 510 is deposited over the first layer 505. A second mask layer 545 (e.g., silicon nitride) is deposited over the first mask layer 510. This second mask layer 545 is coated with resist 547 and patterned with photolithography to form first features 530 including features 532a-g and 534a-b. The second mask layer 545 is then plasma etched to expose the first mask layer 510. The resist (and BARC layer, if present) is then removed by a wet or plasma strip. The result is illustrated in FIG. 5B and FIG. 5B' where the second mask layer 545 forms a pattern on top of the first mask layer 510.

Figure 5E:
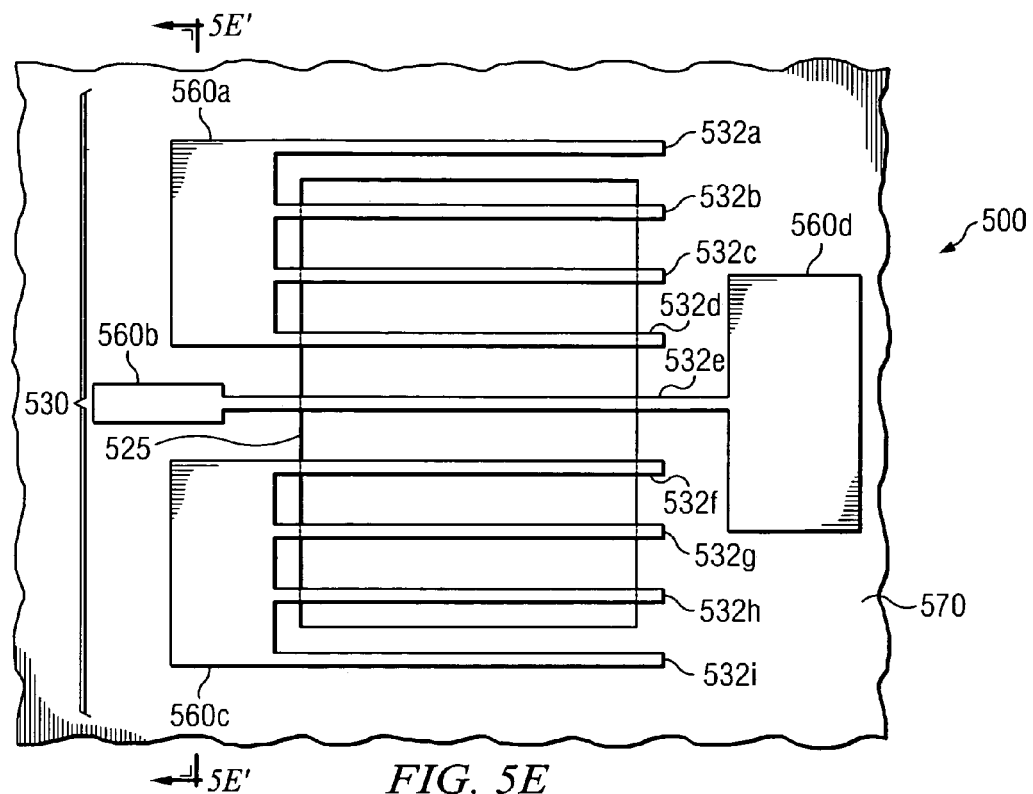
Figure 5E:
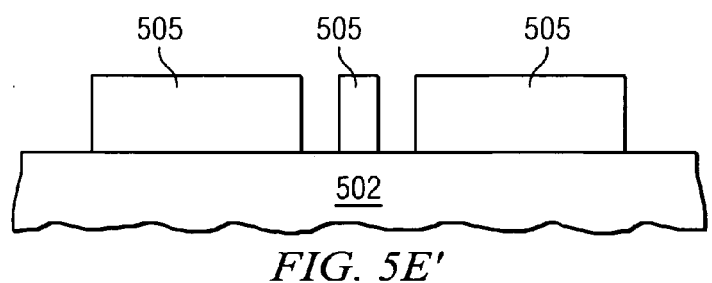

A third mask layer 550 (e.g., BARC) is then deposited. The third mask layer 550 is patterned using photolithography, with the BARC opened using a plasma etch. This is the situation depicted in FIG. 5C and FIG. 5C' where the third mask 550 covers some areas of the first mask layer 510 and slightly overlaps the second mask layer 545. A plasma etch is used to transfer the second and third mask patterns into the first mask layer 510. The second and third masks are then removed by a wet or plasma strip, leaving the first mask layer 510 with the desired pattern on top of the first layer 505 as shown in FIG. 5D and FIG. 5D'. A plasma etch is used to transfer the pattern from the first mask layer 510 into the first layer 505. The first mask layer 510 is then removed by a wet or plasma strip, leaving the first layer 505 with the desired pattern as shown in FIG. 5E and FIG. 5E'.

According to various embodiments, the first mask layer 510 can comprise SRN. In other embodiments, the first mask layer 510 can comprise for example, an insulator material, such as silicon oxide, BARC, TEOS, or SiON, or other masking materials, or combinations thereof.

According to various embodiments, the second mask layer 545 can comprise BARC. In other embodiments, the second mask layer 545 can comprise for example, an insulator material, such as silicon oxide, SRN, TEOS, or SiON, or other masking materials, or combinations thereof.

According to various embodiments, a computer readable medium containing program code is provided that configures a processor to use a first mask layer to pattern first features in a first layer formed over a substrate. The computer readable medium can also include program code for forming a second mask layer over the first features and program code for using the second mask layer to pattern portions of the first features and to pattern a portion of the first layer. Moreover, the computer readable medium can comprise program code for use in removing the remaining second mask layer and removing the remaining first mask layer.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising."

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:
1. A method of making an integrated circuit, comprising:
providing first and second photomasks including cooperating first and second patterns for respectively defining first and second features in a layer of material of the integrated circuit;

forming the layer of material of the integrated circuit over a semiconductor substrate;

forming a first layer of hardmask material over the layer of material;

forming a first layer of photoresist material over the first layer of hardmask material;

patterning the first layer of photoresist material with the first pattern using the first photomask; including patterning the first layer of photoresist for defining portions to be trimmed and portions to be left of the first features;

selectively etching the first layer of hardmask material through the patterned first layer of photoresist material in a first etch, to transfer the first pattern, including the patterning for defining the portions to be trimmed and the portions to be left of the first features, to the first layer of hardmask material;

removing the patterned first layer of photoresist material following the first etch;

forming a second layer of hardmask material over the first layer of hardmask material after removing the patterned first layer of photoresist material; the second layer of hardmask material having a different etch chemistry than the first layer of hardmask material;

forming a second layer of photoresist material over the second layer of hardmask material;

patterning the second layer of photoresist material with the second pattern using the second photomask; including patterning the second layer of photoresist for defining the second features, for defining the portions to be trimmed of the first features, and for masking the portions to be left of the first features;

selectively etching the second layer of hardmask material through the patterned second layer of photoresist material in a second etch, to transfer the second pattern, including the patterning for defining the second features, for defining the portions to be trimmed of the first features, and for masking the portions to be left of the first features, to the second layer of hardmask material;

removing the patterned second layer of photoresist material following the second etch;

selectively etching the first layer of hardmask material through the patterned second layer of hardmask material in a third etch, to transfer the second pattern, including the patterning for defining the second features and the portions to be trimmed of the first features, to the first layer of hardmask material, while masking the portions to be left of the first features; the etching to transfer the second pattern cooperating with the previously etch transferred first pattern to remove the portions of the transferred first pattern defining the portions to be trimmed of the first features, to leave by masking from etching the portions of the transferred first pattern defining the portions to be left, and to transfer by etching the patterning of the second features;

removing the patterned second layer of hardmask material following the third etch; and selectively etching the layer of material of the integrated circuit through the twice patterned first layer of hardmask material in a fourth etch, to transfer the cooperated first and second patterns to define the first and second features.

2. The method of claim 1, wherein the layer of material of the integrated circuit comprises a layer of polysilicon material.

3. The method of claim 1, wherein the first features comprise transistor gate features.

4. The method of claim 1, wherein the first and second layers of hardmask material each comprises at least one of silicon oxide, silicon oxynitride, silicon rich nitride, TEOS, or a bottom anti-reflection coating.

5. The method of claim 4, wherein the first layer of hardmask material comprises a layer of silicon rich nitride.

6. The method of claim 1, wherein the second layer of hardmask material comprises a bottom anti-reflection coating.

7. The method of claim 1, wherein the first pattern includes ghost features; and the second pattern cooperates with the first pattern to remove the ghost features.

8. The method of claim 1, wherein the semiconductor substrate includes an active region; the first pattern defines gate fingers over the active region; and the second pattern cooperates with the first pattern to define gate busses and bond pads connecting with the gate fingers.

9. The method of claim 8, wherein the first pattern further comprises patterning to define ghost features; and wherein the second pattern further comprises patterning to remove the ghost features.

10. The method of claim 1, wherein the first pattern comprises patterning to define gates; and wherein the second pattern comprises patterning to trim the gates.

11. The method of claim 1, wherein the first pattern comprises patterning to define gate features that extend over active regions to field regions of the substrate; and the second pattern comprises patterning to define features in contact with the gates, while masking at least some of the gate features.

12. The method of claim 1, wherein the second photomask serves to define features not defined by the first photomask, and to cover and protect at least some features defined by the first photomask.

13. A method of making an integrated circuit, comprising:

providing first and second photomasks including cooperating first and second patterns for respectively defining features over active area and features over field oxide of gate structures in a layer of polysilicon gate electrode material of the integrated circuit;

forming the layer of polysilicon gate electrode material of the integrated circuit over a semiconductor substrate;

forming a first layer of hardmask material over the layer of gate electrode material;

forming a first layer of photoresist material over the first layer of hardmask material;

patterning the first layer of photoresist material with the first pattern using the first photomask; including patterning the first layer of photoresist for defining portions to be trimmed and portions to be left of the features over active area of the gate structures;

selectively etching the first layer of hardmask material through the patterned first layer of photoresist material in a first etch, to transfer the first pattern, including the patterning for defining the portions to be trimmed and the portions to be left of the features over active area of the gate structures, to the first layer of hardmask material;

removing the patterned first layer of photoresist material following the first etch;

forming a second layer of hardmask material over the first layer of hardmask material after removing the patterned first layer of photoresist material; the second layer of hardmask material having a different etch chemistry than the first layer of hardmask material;

forming a second layer of photoresist material over the second layer of hardmask material;

patterning the second layer of photoresist material with the second pattern using the second photomask; including patterning the second layer of photoresist for defining the features over field oxide of the gate structures, for defining the portions to be trimmed of the features over active area of the gate structures, and for masking the portions to be left of the features over active area of the gate structures;

selectively etching the second layer of hardmask material through the patterned second layer of photoresist material in a second etch, to transfer the second pattern, including the patterning for defining the features over field oxide of the gate structures, for defining the portions to be trimmed of the features over active area of the gate structures, and for masking the portions to be left of the features over active area of the gate structures, to the second layer of hardmask material;

removing the patterned second layer of photoresist material following the second etch;

selectively etching the first layer of hardmask material through the patterned second layer of hardmask material in a third etch, to transfer the second pattern, including the patterning for defining the features over field oxide of the gate structures and the portions to be trimmed of the features over active area of the gate structures, to the first layer of hardmask material, while masking the portions to be left of the features over active area of the gate structures; the etching to transfer the second pattern cooperating with the previously etch transferred first pattern to remove the portions of the transferred first pattern defining the portions to be trimmed of the features over active area of the gate structures, to leave by masking from etching the portions of the transferred first pattern defining the portions to be left of the features over active area, and to transfer by etching the patterning of the features over field oxide of the gate structures;

removing the patterned second layer of hardmask material following the third etch; and selectively etching the layer of polysilicon gate electrode material of the integrated circuit through the twice patterned first layer of hardmask material in a fourth etch, to transfer the cooperated first and second patterns to define the features over active area and features over field oxide of the gate structures.

14. The method of claim 13, wherein the first and second layers of hardmask material each comprises at least one of silicon oxide, silicon oxynitride, silicon rich nitride or TEOS.

15. The method of claim 14, wherein the second layer comprises a bottom anti-reflection coating.

16. The method of claim 15, wherein the first layer of hardmask material comprises a layer of silicon rich nitride.

17. The method of claim 13, wherein the features over active area of the gate structures comprise gate fingers, and the features over field oxide of the gate structures comprise at least one of gate busses or bond pads.

18. The method of claim 17, wherein the portions to be trimmed define ghost gate fingers.

19. The method of claim 13, wherein the portions to be trimmed define ghost features.

* * * * *